US006997782B2

(12) United States Patent
Nishi et al.

(10) Patent No.: US 6,997,782 B2
(45) Date of Patent: *Feb. 14, 2006

(54) POLISHING APPARATUS AND A METHOD OF POLISHING AND CLEANING AND DRYING A WAFER

(75) Inventors: Toyomi Nishi, Yokohama (JP); Tetsuji Togawa, Fujisawa (JP); Harumitsu Saito, Yokohama (JP); Manabu Tsujimura, Yokohama (JP); Hiromi Yajima, Yokohama (JP); Kazuaki Himukai, Chigasaki (JP); Shoichi Kodama, Tokyo (JP); Yukio Imoto, Zama (JP); Riichiro Aoki, Tokyo (JP); Masako Watase, Yokohama (JP); Atsushi Shigeta, Fujisawa (JP); Shiro Mishima, Yokkaichi (JP); Gisuke Kouno, Oita (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 418 days.

This patent is subject to a terminal disclaimer.

(21) Appl. No.: 10/255,793

(22) Filed: Sep. 27, 2002

(65) Prior Publication Data

US 2003/0040261 A1  Feb. 27, 2003

Related U.S. Application Data

(63) Continuation of application No. 08/884,410, filed on Jun. 27, 1997, now Pat. No. 6,500,051, which is a continuation of application No. 08/563,295, filed on Nov. 28, 1995, now Pat. No. 5,679,059.

(30) Foreign Application Priority Data

Nov. 29, 1994 (JP) ..................................... 6-319289
Dec. 6, 1994 (JP) ..................................... 6-330209
Dec. 6, 1994 (JP) ..................................... 6-330210

(51) Int. Cl.
*B24B 1/00* (2006.01)

(52) U.S. Cl. .............................. 451/41; 451/57; 451/59; 451/66; 451/67

(58) Field of Classification Search .................... 451/6, 451/57, 59, 66, 9, 67, 41; 134/902, 2, 3, 134/95.1; 454/187
See application file for complete search history.

(56) References Cited

U.S. PATENT DOCUMENTS 4,050,954 A  9/1977  Basi (Continued)

FOREIGN PATENT DOCUMENTS

| JP | 60-8189 | 3/1985 |
|----|---------|--------|
| JP | 63-207559 | 8/1988 |
| JP | 6-252110 | 9/1994 |

OTHER PUBLICATIONS

Request for Information, 3, 1.

(Continued)

*Primary Examiner*—George Nguyen
(74) *Attorney, Agent, or Firm*—Wenderoth, Lind & Ponack, L.L.P.

(57) ABSTRACT

A polishing apparatus for polishing a surface of a workpiece includes a housing unit, a partition wall partitioning an interior of the housing unit into a first chamber and a second chamber, a polishing section disposed in the first chamber and having a turntable with an abrasive cloth mounted on an upper surface thereof and a top ring positioned above the turntable for supporting the workpiece to be polished and pressing the workpiece against the abrasive cloth, and a cleaning section disposed in the second chamber and cleaning the workpiece which has been polished. The polishing apparatus further includes a transferring device for transferring the workpiece which has been polished from the polishing section to the cleaning section through an opening and an exhaust system for exhausting ambient air from each of the polishing section and cleaning section separately and independently.

20 Claims, 11 Drawing Sheets

U.S. PATENT DOCUMENTS

| | | | | |
|---|---|---|---|---|
| 4,680,893 | A | * | 7/1987 | Cronkhite et al. ............. 451/57 |
| 4,836,733 | A | * | 6/1989 | Hertel et al. ............. 414/744.5 |
| 4,838,150 | A | | 6/1989 | Suzuki et al. |
| 5,096,477 | A | | 3/1992 | Shinoda et al. |
| 5,131,799 | A | * | 7/1992 | Nishi et al. ............. 414/416.09 |
| 5,278,494 | A | * | 1/1994 | Obigane ..................... 324/754 |
| 5,299,584 | A | | 4/1994 | Miyazaki et al. |
| 5,329,732 | A | | 7/1994 | Karlsrud et al. |
| 5,333,413 | A | * | 8/1994 | Hashimoto ..................... 451/9 |
| 5,354,995 | A | * | 10/1994 | Endo et al. ............. 250/559.29 |
| 5,425,793 | A | | 6/1995 | Mori et al. |
| 5,431,600 | A | | 7/1995 | Murata et al. |
| 5,566,076 | A | * | 10/1996 | Kuroda ....................... 700/213 |
| 5,567,927 | A | * | 10/1996 | Kahn et al. ............. 235/462.01 |
| 5,568,821 | A | * | 10/1996 | Ohmori et al. ............... 134/61 |
| 5,655,954 | A | | 8/1997 | Oishi et al. |
| 5,679,059 | A | * | 10/1997 | Nishi et al. ................... 451/41 |
| 5,679,060 | A | * | 10/1997 | Leonard et al. ............... 451/43 |
| 5,779,520 | A | | 7/1998 | Hayakawa |
| 5,885,138 | A | | 3/1999 | Okumura |
| 6,500,051 | B1 | * | 12/2002 | Nishi et al. ................... 451/41 |

OTHER PUBLICATIONS

Ebara CMP, 58, 2.
Quotation 1, 98 (92sheets), 3.
Quotation 2, 9, 4.
Purchase Order, 4, 5.
Letter, 3 (original and translation), 6.
Experiment Summary, 4, 7.
Declaration of M. Hirose, 6 (original and translation), 8.
Declaration of N. Kimura, 13 (original and translation), 9.
Declaration of M. Tsujimura, 12 (original and translation), 10.
Declaration of N. Yago, 4 (original and translation), 11.
Acceptance Test Report Jun. 20, 1994, 23, 12.
EPM test result, 2, 13.
IBM Technology Products B/650 ASTC Request for Information, 16, 14.
Supplemental Declaration of N. Kimura, 4 (original and translation, 15.
Supplemental Declaration of N. Yago, 3 (original and translation), 16.
William C. O'Mara, "Planarization by Chemical-Mechanical Polishing for Multilevel Metal Integrated Circuits", O'Mara & Associates, 1994, pp. 62-64 and 37.

* cited by examiner

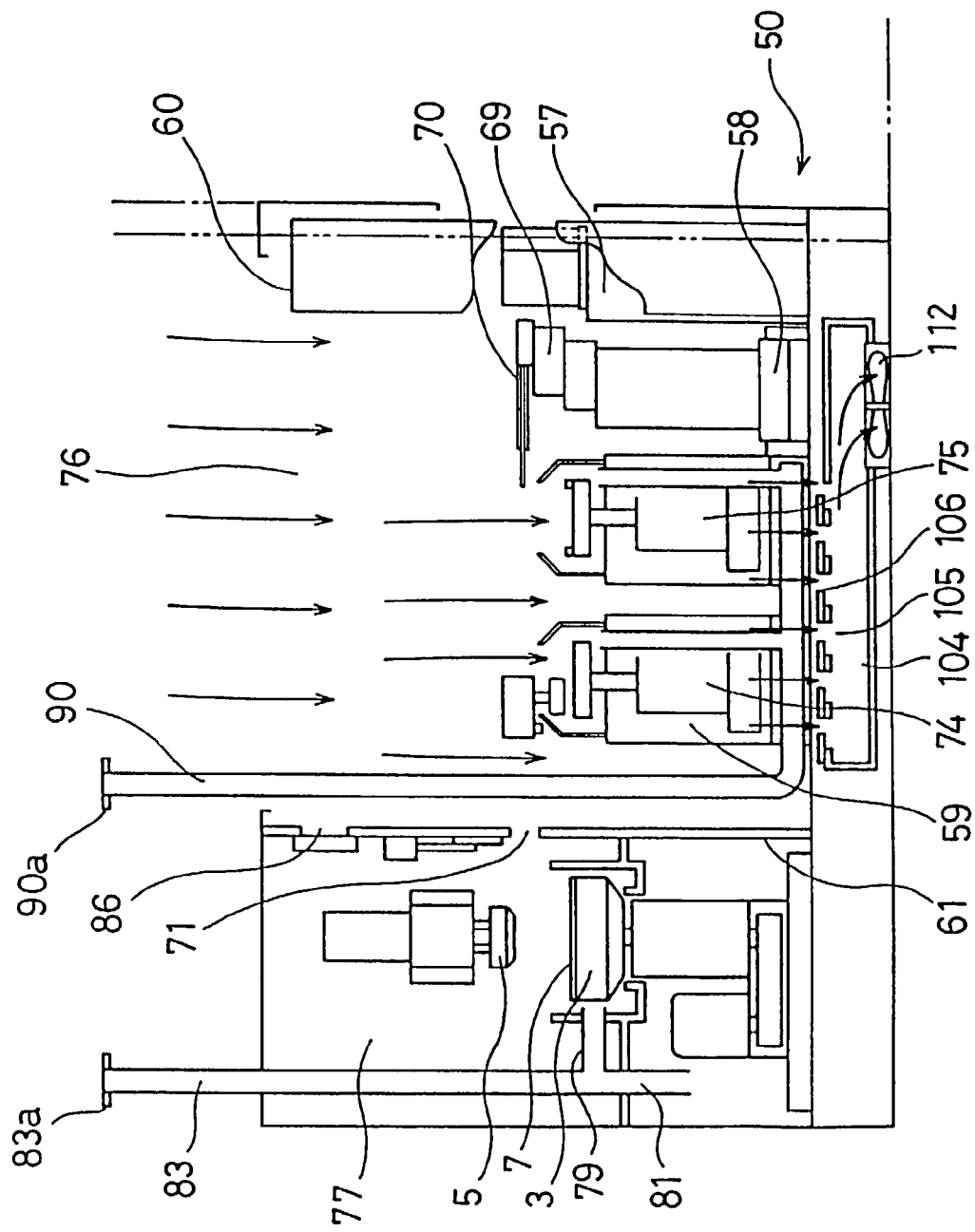

POLISHING APPARATUS AND A METHOD OF POLISHING AND CLEANING AND DRYING A WAFER

This is a continuation of application Ser. No. 08/884,410, filed Jun. 27, 1997, and now U.S. Pat. No. 6,500,051, issued Dec. 31, 2002, which is a continuation of application Ser. No. 08/563,295, filed Nov. 28, 1995, and now U.S. Pat. No. 5,679,059.

BACKGROUND OF THE INVENTION

1. Field of the Invention

The present invention relates to a polishing apparatus, and more particularly to a polishing apparatus having a polishing section for polishing a workpiece such as a semiconductor wafer to a flat mirror finish and a cleaning section for cleaning the workpiece which has been polished.

2. Description of the Related Art

Recent rapid progress in semiconductor device integration demands smaller and smaller wiring patterns or interconnections and also narrower spaces between interconnections which connect active areas. One of the processes available for forming such interconnection is photolithography. Though the photolithographic process can form interconnections that are at most 0.5 $\mu$m wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus.

Conventionally, a polishing apparatus has a turntable and a top ring which rotate at respective individual speeds. An abrasive cloth is attached to the upper surface of the turntable. A semiconductor wafer to be polished is placed on the abrasive cloth and clamped between the top ring and the turntable. During operation, the top ring exerts a certain pressure on the turntable, and the surface of the semiconductor wafer held against the abrasive cloth is therefore polished to a flat mirror finish while the top ring and the turntable are rotating.

Further, in the polishing apparatus, abrasive slurry is supplied from a nozzle onto the abrasive cloth attached to the upper surface of the turntable. The abrasive slurry contains abrasive material such as silicon dioxide ($SiO_2$) or cerium dioxide ($CeO_2$) having a diameter of 1 $\mu$m or less in a liquid. The abrasive slurry contains water, abrasive material, and a small amount of dispersing agent to prevent aggregation of the abrasive material. Further, in order to perform a chemical polishing in addition to a mechanical polishing, acid or alkali may be added to the abrasive slurry.

The surface of the semiconductor wafer which has been polished is generally quite contaminated not only with particles of semiconductor material but also with abrasive material. The count of contaminants on the surface of the semiconductor wafer may be as high as 100,000 particles per wafer, and it is required to reduce this count to about 100 particles per wafer by some efficient method.

The conventional polishing apparatus could not be placed in a clean room because of the dust particles generated by the polishing apparatus itself. Once the contaminants which adhere to the surface of the polished semiconductor wafer have been dried, it is difficult to remove the contaminants by cleaning. Therefore, the present practice is to preserve the semiconductor wafers which have been polished in water, immediately after polishing, in a specially constructed water-containing carrier which is brought into the clean room so that the semiconductor wafers may be cleaned in a cleaning device.

However, in the conventional apparatus, the cleaning device is spaced from the polishing apparatus and the semiconductor wafers must be transferred from the polishing apparatus to the cleaning device in such a state that they are preserved in water, thus productivity of the semiconductor wafers are lowered. Further, because the cleaning device itself becomes quite polluted from the dust particles adhering to the semiconductor wafers, it is not possible to use general cleaning devices provided in the clean room. That is, a special cleaning machine must be provided for exclusively cleaning the semiconductor wafers which have been polished. This leads to high apparatus cost.

SUMMARY OF THE INVENTION

It is therefore an object of the present invention to provide a polishing apparatus which can be installed in a clean room and does not contaminate the ambient atmosphere in the clean room, and which can polish, clean and dry workpieces such as semiconductor wafers so that the workpieces can be discharged to a next processing station by using regular carriers available generally in the clean room.

Another object of the present invention is to provide a polishing apparatus which can prevent particulate contamination originating in polishing activities so that the polishing apparatus can be installed in a clean room.

According to one aspect of the present invention, there is provided a polishing apparatus for polishing a surface of a workpiece comprising: a housing unit; a partition wall partitioning an interior of the housing unit into a first chamber and a second chamber, the partition wall having a first opening for allowing the workpiece to pass therethrough; a polishing section having a turntable with an abrasive cloth mounted on an upper surface thereof and a top ring positioned above the turntable for supporting the workpiece to be polished and pressing the workpiece against the abrasive cloth, the polishing section being disposed in the first chamber; a cleaning section for cleaning the workpiece which has been polished, the cleaning section being disposed in the second chamber; a transferring device for transferring the workpiece which has been polished from the polishing section to the cleaning section through the first opening; and exhaust means for exhausting ambient air from each of the polishing section and the cleaning section separately and independently.

According to the polishing apparatus presented above, the polishing section and the cleaning section are housed in the housing unit, and the two sections are isolated from each other by the partition wall. Therefore, the entire polishing apparatus can be disposed in a clean room without contaminating the clean room atmosphere. The semiconductor wafers can be polished and cleaned within the polishing apparatus, and transferred to the next processing stations using the regular carriers available in the clean room generally. The two sections of the polishing apparatus are separated by the partition wall having the opening which is closed with a shutter, and the ambient atmospheres in the polishing section and the cleaning section are exhausted separately and independently. This arrangement prevents any dust particles such as mist of abrasive slurry and ground-off material generated during polishing operation from contaminating the clean room by either maintaining the polishing section at the pressure lower than the cleaning section or by closing a shutter which is provided for the opening of the partition wall.

According to another aspect of the present invention, there is provided a polishing apparatus for polishing a surface of a workpiece comprising: a housing unit; a partition wall partitioning an interior of the housing unit into a first chamber and a second chamber, the partition wall having a first opening for allowing the workpiece to pass therethrough; a polishing section having a turntable with an abrasive cloth mounted on an upper surface thereof and a top ring positioned above the turntable for supporting the workpiece to be polished and pressing the workpiece against the abrasive cloth, the polishing section being disposed in said first chamber; a cleaning section for cleaning the workpiece which has been polished, the cleaning section being disposed in the second chamber; a transferring device for transferring the workpiece which has been polished from the polishing section to the cleaning section through the first opening; and exhaust means for exhausting ambient air from each of the polishing section and the cleaning section; wherein the cleaning section comprises a cleaning unit for cleaning the workpiece while supplying cleaning solvent and a drying unit for drying the workpiece which has been cleaned.

According to the polishing apparatus presented above, a workpiece such as a semiconductor wafer is polished in the polishing section, the workpiece which has been polished is transferred from the polishing section to the cleaning section, and then the workpiece is cleaned and dried in the cleaning section. Therefore, the workpiece is discharged from the polishing apparatus in such a state the workpiece is clean and dry.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 11 is a side view showing the internal arrangement of a polishing apparatus according to a modified embodiment of the third embodiment of the present invention.

DETAILED DESCRIPTION OF PREFERRED EMBODIMENTS

A polishing apparatus according to a first embodiment of the present invention will be described below with reference to FIGS. 1 and 2.

Figure 1:
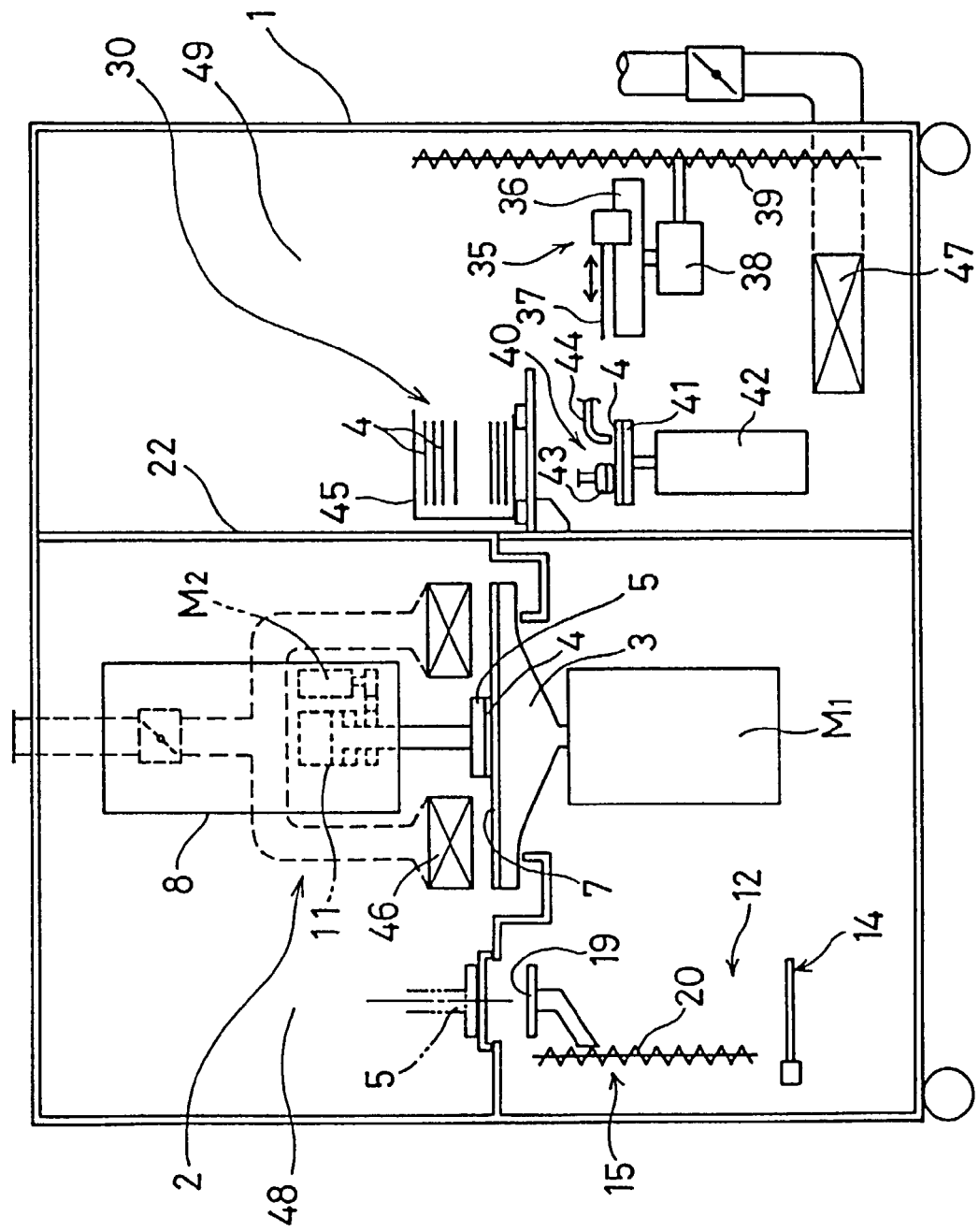
FIG. 1 is an elevational cross-sectional view of a polishing apparatus according to a first embodiment of the present invention.
Figure 2:
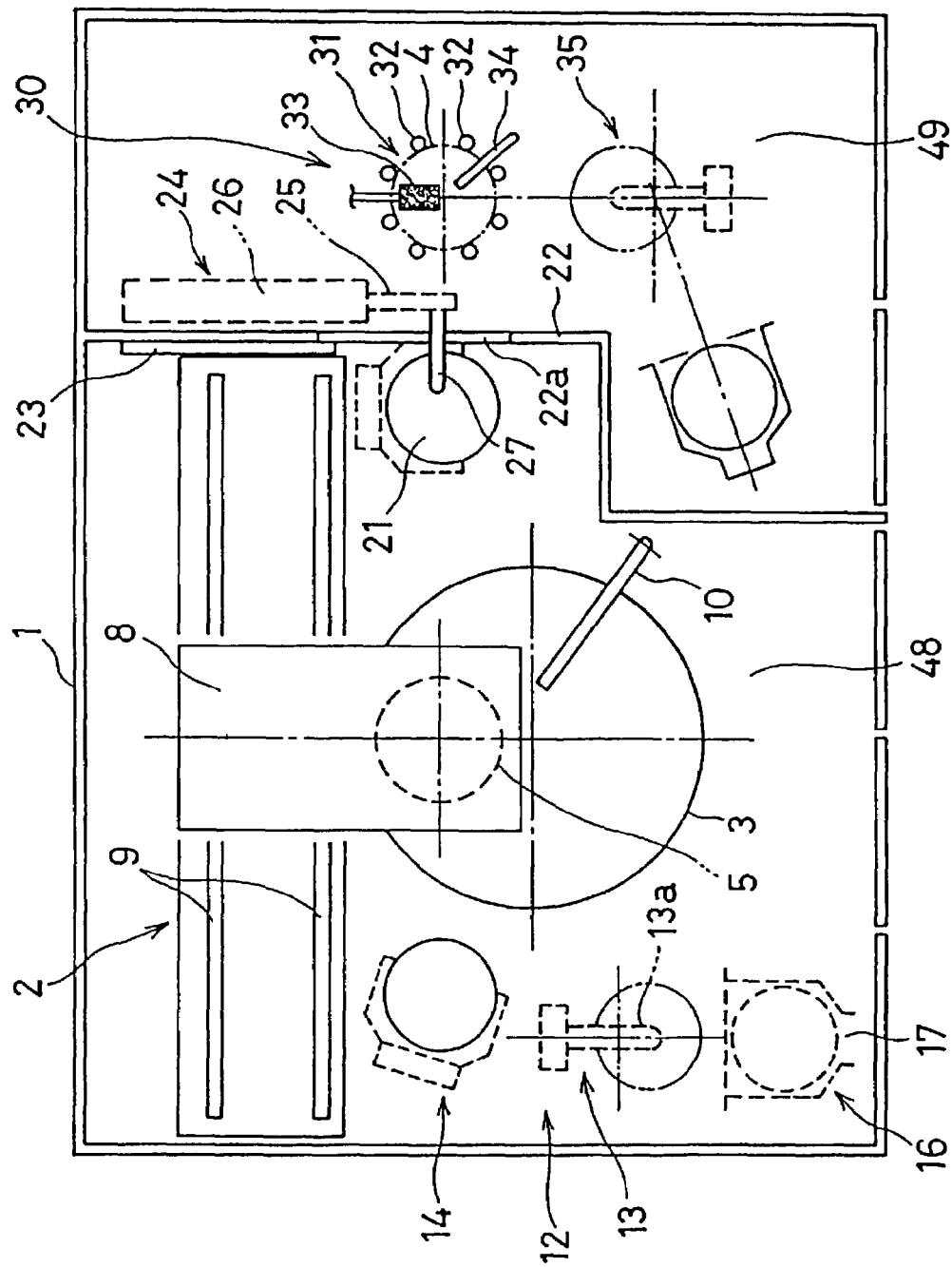
FIG. 2 is a cross-sectional plan view of the polishing apparatus according to the first embodiment of the present invention.

As shown in FIGS. 1 and 2, a polishing apparatus has a housing unit 1 with side walls, a top wall and a bottom wall housing a polishing section 2 for polishing semiconductor wafers and a cleaning section 30 for cleaning the semiconductor wafers which have been polished. The interior of the housing unit 1 is partitioned by a partition wall 22 into a first chamber 48 and a second chamber 49. The polishing section 2 is disposed in the first chamber 48, and the cleaning section 30 is disposed in the second chamber 49.

The polishing section 2 comprises a turntable 3 and a top ring 5 for holding a semiconductor wafer 4 and pressing the semiconductor wafer 4 against the turntable 3. The turntable 3 is coupled to a motor $M_1$. An abrasive cloth 7 is attached to an upper surface of the turntable 3. The top ring 5 is coupled to a top ring head 8 which is provided with a top ring motor $M_2$ for rotating the top ring 5 and an air cylinder 11 for moving the top ring 5 vertically, whereby the top ring 5 is movable up and down and rotatable about an axis of the top ring 5. The top ring head 8 is movable across the turntable 3 along guide rails 9. An abrasive slurry containing abrasive material such as silicon dioxide ($SiO_2$) or cerium dioxide ($CeO_2$) is supplied from a nozzle 10 onto the upper surface of the abrasive cloth 7.

A loading device 12 for supplying the semiconductor wafer 4 to the top ring 5 comprises a first transfer unit 13, an inverter 14 and a second transfer unit 15. The first transfer unit 13 takes out the semiconductor wafer 4 from a cassette 17 placed at a cassette station 16, and transfers the semiconductor wafer 4 to the inverter 14 which inverts the semiconductor wafer 4 so that the surface to be polished faces downward. The inverted semiconductor wafer 4 is received by the first transfer unit 13 and transferred to the second transfer unit 15.

The second transfer unit 15 comprises a wafer holding member 19 for holding the semiconductor wafer 4 and a screw rod 20 for moving the wafer holding member 19 vertically, and transfers the semiconductor wafer 4 supplied from the first transfer unit 13 to the top ring 5.

The semiconductor wafer 4 is then polished by pressing the semiconductor wafer 4 against the abrasive cloth 7 on the turntable 3. After polishing is completed, the semiconductor wafer 4 is transferred to a position above a wafer supporting station 21 by the top ring 5 which moves integrally with the top ring head 8 along the guide rails 9. The semiconductor wafer 4 is removed from the top ring 5 and placed on the wafer supporting station 21.

The partition wall 22 which separates the polishing section 2 from the cleaning section 30 has an opening 22a. A shutter 23 is disposed at the opening 22a to act as a door for the opening 22a. An inverter 24 is disposed adjacent to the partition wall 22. The inverter 24 comprises an inverter shaft 25, an inverter actuator 26 and an inverter arm 27. The arm 27 is rotated by the actuator 26 through the inverter shaft 25.

When the shutter 23 is open, the inverter arm 27 rotates and holds the semiconductor wafer 4 placed on the wafer supporting station 21 by vacuum suction, and the semiconductor wafer 4 is inverted while it is transferred to the cleaning section 30 by the reverse rotation of the inverter arm 27 through the opening 22a.

The cleaning section 30 comprises a first-stage cleaning unit 31 for performing a primary cleaning of the semiconductor wafer 4 which has been polished, and a second-stage cleaning unit 40 for performing a secondary cleaning of the semiconductor wafer 4. The first-stage cleaning unit 31 comprises a plurality of rollers 32 for holding the outer periphery of the semiconductor wafer 4 and rotating the semiconductor wafer 4, a sponge roller 33 for scrubbing the semiconductor wafer 4, and a cleaning solvent supply pipe 34 for supplying cleaning solvent such as water to the semiconductor wafer 4. While the semiconductor wafer 4 is held by the rollers 32, the semiconductor wafer 4 is rotated by the rollers 32 driven by a motor (not shown). The primary cleaning process is carried out by pressing the sponge roller 33 against the semiconductor wafer 4 while cleaning solvent is supplied to the semiconductor from the cleaning solvent supply pipe 34. The semiconductor wafer 4 which has been subjected to the primary cleaning is transferred to the second-stage cleaning unit 40 by a third transfer unit 35.

The third transfer unit 35 comprises a wafer holding station 36, a wafer holding member 37 disposed above the wafer holding station 36, a motor 38 for rotating the wafer holding station 36 and a screw rod 39 for moving the wafer holding station 36 vertically. The wafer holding member 37 moves in the horizontal direction indicated by an arrow in FIG. 1 and performs handling of the semiconductor wafer 4 positioned away from the wafer holding station 36. After receiving the semiconductor wafer 4 which has been subjected to the primary cleaning, the third transfer unit 35 retracts the wafer holding member 37, and moves the semiconductor wafer 4 to a position above the wafer holding station 36. Thereafter, the third transfer unit 35 lowers the wafer holding station 36 while rotating the wafer holding station 36, and transfers the semiconductor wafer 4 to the second-stage cleaning unit 40 by extending the wafer holding member 37 again.

The second-stage cleaning unit 40 comprises a wafer holding station 41, a motor 42 for rotating the wafer holding station 41, a cleaning sponge 43 for scrubbing the semiconductor wafer 4 and a cleaning solvent supply pipe 44 for supplying cleaning solvent such as water to the semiconductor wafer 4. The semiconductor wafer 4 is cleaned on the wafer holding station 41 by supplying cleaning solvent to the semiconductor wafer 4 from the cleaning solvent supply pipe 44 and pressing the cleaning sponge 43 against the semiconductor wafer 4. After the cleaning process is completed, the sponge 43 is retracted, the water supply is stopped, and the semiconductor wafer 4 is spin-dried by spinning the wafer holding station 41 at a high speed by the motor 42.

After the secondary cleaning and spin-drying are completed, the semiconductor wafer 4 is again received by the wafer holding member 37 of the third transfer unit 35, and is moved to a position above the wafer holding station 36. The wafer holding station 36 is raised while it is rotated, and the wafer holding member 37 is extended to store the semiconductor wafer 4 which has been polished, cleaned and dried in the cassette 45.

The polishing section 2 and the cleaning section 30 are provided with exhaust ducts 46 and 47, respectively for exhausting an ambient air in the polishing section 2 and the cleaning section 30 separately and independently.

The operation of the polishing apparatus in FIGS. 1 and 2 will be described below.

A semiconductor wafer 4 is taken out from the cassette 17 placed at the cassette station 16 by means of a tongue member 13a of the first transfer unit 13, and transferred to the inverter 14. The semiconductor wafer 4 is inverted by the inverter 14 so that the surface to be polished faces downward, received by the first transfer unit 13, and transferred onto the wafer holding member 19 of the second transfer unit 15.

Next, the top ring head 8 moves along the guide rails 9 so that the top ring 5 is positioned above the wafer holding member 19 of the second transfer unit 15. The wafer holding member 19 is then raised to transfer the semiconductor wafer 4 held thereon to the top ring 5.

The top ring 5 holds the semiconductor wafer 4, and moves to a polishing position above the turntable 3. The turntable 3 and the top ring 5 are rotated, and the abrasive slurry containing the abrasive material is supplied from the nozzle 10 to the upper surface of the abrasive cloth 7 on the turntable 3. The top ring 5 is lowered and presses the semiconductor wafer 4 against the abrasive cloth 7, thereby polishing the semiconductor wafer 4.

After polishing is completed, the top ring head 8 moves along the guide rails 9, and the top ring 5 holding the semiconductor wafer 4 is positioned directly above the wafer supporting station 21. Then, the semiconductor wafer 4 is removed from the top ring 5 and placed on the wafer supporting station 21. The top ring 5 now moves towards the second transfer unit 15 to carry out the next polishing operation of another semiconductor wafer 4.

When the semiconductor wafer 4 which has been polished is placed on the wafer supporting station 21, the shutter 23 is opened, and the inverter arm 27 of the inverter 24 is rotated and positioned above the semiconductor wafer 4 to pick up the semiconductor wafer 4 by vacuum suction. The semiconductor wafer 4 is then inverted by the reverse rotation of the arm 27, and transferred to the first-stage cleaning unit 31. At this time, the opening 22a of the partition wall 22 is in an open position to allow the arm 27 holding the semiconductor wafer 4 to pass therethrough. When the semiconductor wafer 4 and the arm 27 have passed through the opening 22a and moved completely into the cleaning section 30, the opening 22a is closed by closing the shutter 23.

After the semiconductor wafer 4 has been transferred to the first-stage cleaning unit 31 by the arm 27, the arm 27 retreats downward. In the first-stage cleaning unit 31, the semiconductor wafer 4 is held by the rollers 32 and rotated by the rollers 32. The primary cleaning is performed by rotating the semiconductor wafer 4 and pressing the sponge roller 33 against the semiconductor wafer 4 while supplying cleaning solvent from the cleaning solvent supply pipe 34 to the semiconductor wafer 4.

The semiconductor wafer 4 which has been subjected to the primary cleaning is received by the third transfer unit 35. After receiving the semiconductor wafer 4, the third transfer unit 35 retracts the wafer holding member 37 to position the semiconductor wafer 4 above the wafer holding station 36. Thereafter, the wafer holding station 36 is lowered while it is rotated, and the semiconductor wafer 4 is transferred to the second-stage cleaning unit 40 by extending the wafer holding member 37 again.

In the second-stage cleaning unit 40, the semiconductor wafer 4 is rotated by the wafer holding station 41, and cleaned by pressing the cleaning sponge 43 against the semiconductor wafer 4 while supplying the cleaning solvent to the semiconductor wafer 4 from the cleaning solvent supply pipe 44. After the secondary cleaning is completed, the cleaning sponge 43 is retracted, water supply is stopped, and the rotational speed of the motor 42 is increased to spin the wafer holding station 41 at a high speed, thereby spin-drying the semiconductor wafer 4.

The semiconductor wafer 4 which has been subjected to the secondary cleaning and drying is again received by the wafer holding member 37 of the third transfer unit 35. After the semiconductor wafer 4 is moved to a position above the wafer holding station 36, the wafer holding station 36 is raised while it is rotated, and the wafer holding member 37 is extended to transfer the semiconductor wafer 4 into the cassette 45.

In the polishing processes described above, the entry of mist of abrasive slurry and ground-off particles of the semiconductor wafer from the polishing section 2 to the cleaning section 30 is effectively prevented by the partition wall 22 disposed between the polishing section 2 and the cleaning section 30. In addition to such a structural feature of the polishing apparatus, separate exhaust systems including the exhaust ducts 46 and 47 are provided to prevent contamination in the cleaning section 30. By maintaining the interior pressure in the polishing section 2 to be lower than that in the cleaning section 30, it is possible to omit the shutter provided on the partition wall 22.

As is apparent from the foregoing description, since the polishing section 2 and the cleaning section 30 are housed in the housing unit 1 with the side walls, the top wall and the bottom wall, and separated from each other by the partition wall 22, it is possible to install the polishing apparatus in the clean room, and to polish and clean the semiconductor wafer 4 without contaminating the clean room atmosphere by the mist and the dust particles generated during polishing and cleaning operations. Further, a regular wafer carrier can be used in the clean room to transfer the polished, cleaned and dried semiconductor wafer to the next processing station.

Furthermore, since the polishing section 2 and the cleaning section 30 are separated by the partition wall 22 having the shutter 23, and separate exhaust systems including the ducts 46 and 47 are provided for each of the polishing section 2 and the cleaning section 30, the mist of the abrasive slurry and ground-off particles of the semiconductor wafer from the polishing section 2 are prevented from entering into the cleaning section 30.

A polishing apparatus according to a second embodiment of the present invention will be described below with reference to FIGS. 3 through 8.

Figure 3:
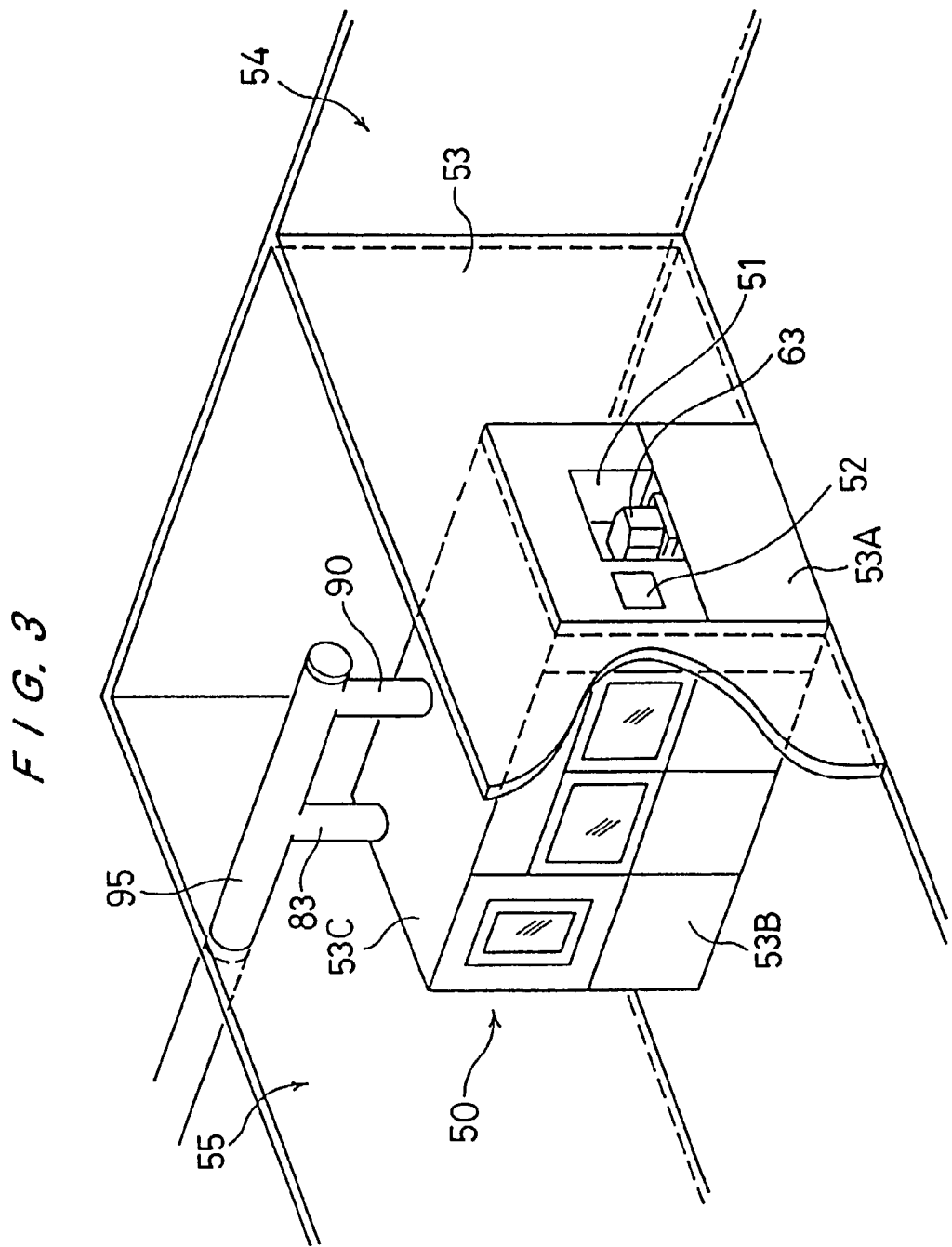
FIG. 3 is a perspective view of a polishing apparatus according to a second embodiment of the present invention.

FIG. 3 is a perspective view of a polishing apparatus 50 which is installed in a clean room. A wall 53 with a side wall 53A partitions the clean room into a working zone 54 of a high degree of cleanliness and a utility zone 55 of a low degree of cleanliness. The side wall 53A is provided with a cassette delivery opening 51 and an operator panel 52. The polishing apparatus 50 is an enclosed structure by a housing unit comprising the side walls 53A, 53B and a ceiling 53C, and houses a load/unload section for delivering a cassette which stores a plurality of semiconductor wafers, a transfer section for transferring the semiconductor wafers, a polishing section for polishing semiconductor wafers, a cleaning unit for cleaning the semiconductor wafers which have been polished, and a control unit for controlling the operation of the overall apparatus. All of the units are mounted on a common base. The entire structure of the polishing apparatus is enclosed by the side walls 53A, 53B and the ceiling 53C, and is in the form of a box.

FIG. 4A shows an interior of the polishing apparatus 50. Although the polishing section 56, and all other sections comprising the load/unload section 57, the transfer section 58, the cleaning section 59 and the control section 60 are installed on the common base 62, but the latter group of sections are isolated from the polishing section 56 by a partition wall 61. The partition wall 61 has an opening 71 which allows the semiconductor wafer 4 to pass therethrough.

FIG. 4B shows the cassette 63 having a plurality of storage shelves 67 on which semiconductor wafers 4 are placed.

As shown in FIG. 4A, the cassette 63 inserted in from the cassette delivery opening 51 (see FIG. 3) is placed on a stage 64 of the load/unload section 57, and the number of semiconductor wafers 4 and the position of the storage shelves 67 are detected by means of a sensor 65, and the detected data are stored in a computer 68 in the control section 60. After the above detection is completed, a finger 70 of a robot 69 disposed on the transfer section 58 takes out a semiconductor wafer 4 from the cassette 63 one by one.

The semiconductor wafer 4 taken out of the cassette 63 is caused to pass through the opening 71, shown in FIG. 4A, of the partition wall 61 while the semiconductor wafer 4 is held by the finger 70 of the robot 69. The semiconductor wafer 4 is held by the top ring 5 in the polishing section 56. The semiconductor wafer 4 held by the top ring 5 is polished by pressing the semiconductor wafer 4 against the abrasive cloth 7 on the turntable 3 while abrasive slurry is supplied onto the abrasive cloth 7.

The semiconductor wafer 4 which has been polished is transferred by the robot 69 to the cleaning section 59 having a cleaning unit 74 and a drying unit 75. After the cleaning of the semiconductor wafer 4 is completed in the cleaning unit 74, the semiconductor wafer 4 is dried in the drying unit 75. After the semiconductor wafer 4 is dried, the semiconductor wafer 4 is transferred from the cleaning section 59 by the robot 69 onto the storage shelf 67 of the cassette 63. A sequence of polishing and cleaning of the semiconductor wafer 4 is completed by the above operations, and other semiconductor wafers 4 are processed in the same ways. When all of the semiconductor wafers 4 in the cassette 63 are processed, the cassette 63 containing the polished and cleaned semiconductor wafers 4 is replaced with another cassette 63 containing semiconductor wafers 4 to be polished and cleaned.

Figure 5:
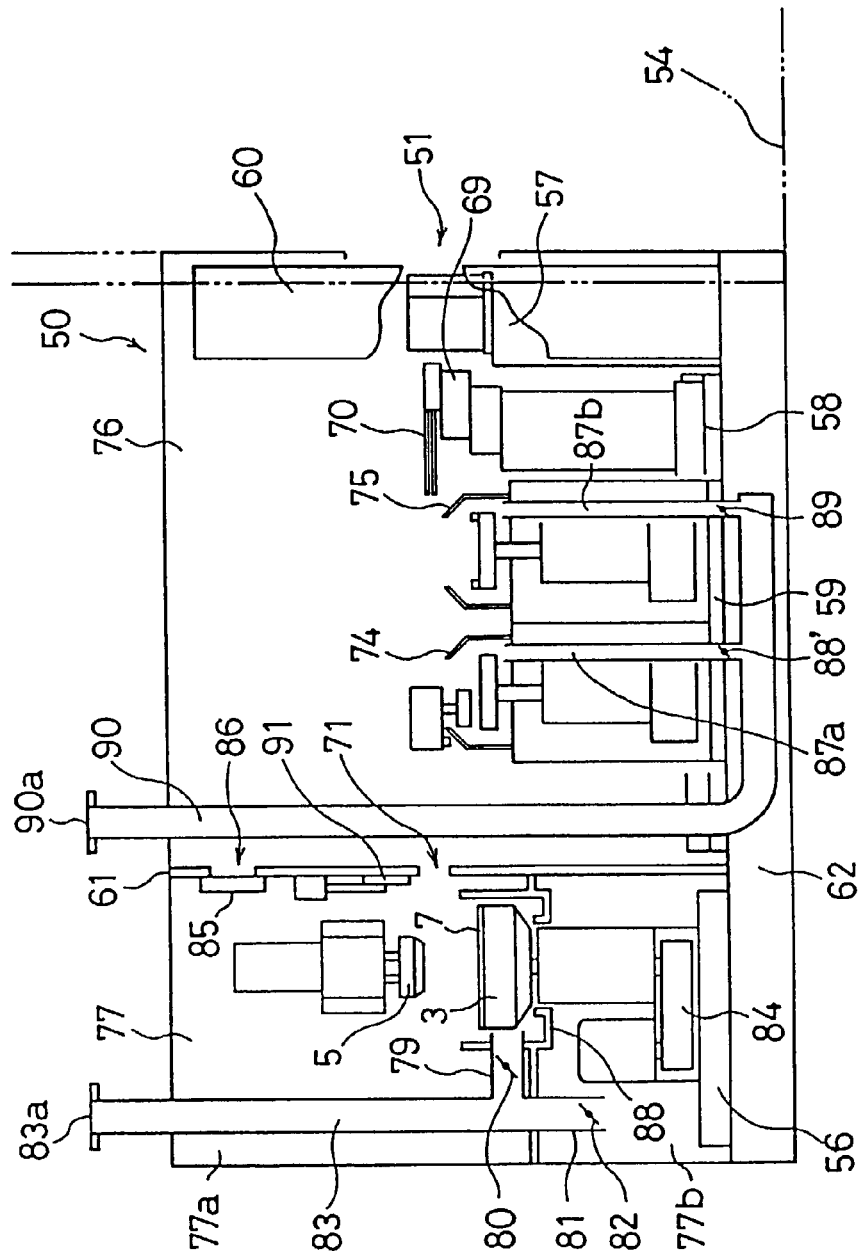
FIG. 5 is a side view showing the internal arrangement of the polishing apparatus of FIG. 3.

FIG. 5 is a side view of the interior of the polishing apparatus 50. The polishing apparatus 50 is divided by the partition wall 61 into a first chamber 77 and a second chamber 76. The polishing section 56 is disposed in the first chamber 77, and the load/unload section 57, the transfer section 58, the cleaning section 59 and the control section 60 are disposed in the second chamber 76.

Inside the first chamber 77, a trough 88 is provided around the outer periphery of the turntable 3 to prevent abrasive slurry or the like from being scattered and to collect them. The trough 88 and a wall extended from the trough 88 horizontally serve to separate the first chamber 77 into an upper chamber 77a and a lower chamber 77b. As shown in FIG. 5, the upper chamber 77a is provided with an upper duct 79 having a damper 80, and the lower chamber 77b is provided with a lower duct 81 having a damper 82. The ducts 79 and 81 are merged into a main duct 83 having an exhaust opening 83a connected to an exhaust pipe 95 (see FIG. 3) which extends from the clean room to an external environment.

The mist produced during polishing operation is exhausted from the exhaust opening 83a through the upper duct 79 and the main duct 83. The dust particles generated from the drive belt of the drive section 84 for the turntable 3 are exhausted from the exhaust opening 83a through the lower duct 81 and the main duct 83. Further, the mist and the dust particles from the first chamber 77 are discharged to an external environment through the exhaust pipe 95. The partition wall 61 is provided with an opening 86, separately from the opening 71. Movable louvres 85 are provided at the opening 86 for adjusting the opening area of the opening 86.

The intake air is introduced into the upper chamber 77a in the following manner. First, air with high cleanliness from the working zone 54 is introduced into the second chamber 76 through the wafer delivery opening 51. Such air then passes through the opening 71 of the partition wall 61 and the opening 86 whose opening area is adjusted appropriately with the louvres 85, and enters the upper chamber 77a. The flow rate is regulated by adjusting the louvres 85 and the valve 80.

The amount of dust particles from the lower chamber 77b is much smaller than that of mist of the abrasive slurry from the upper chamber 77a. Therefore, only a small volume of air flows from the lower chamber 77b, thus the opening degree of the valve 82 is small to thus produce a slight negative pressure in the lower chamber 77b. A small amount of air corresponding to the exhausted air is supplied to the lower chamber 77b through a small clearance between the structural members.

The cleaning unit 74 and the drying unit 75 located in the cleaning section 59 in the second chamber 76 are provided with respective exhaust ducts 87a and 87b having adjusting valves 88' and 89, respectively. The ducts 87a and 87b are merged into a main duct 90 having an exhaust opening 90a connected to the exhaust pipe 95 (see FIG. 3). Therefore, the mist generated from the cleaning unit 74 and the drying unit 75 is exhausted from the exhaust opening 90a through the ducts 87a and 87b and the main duct 90, and is discharged to an external environment through the exhaust pipe 95. Intake air corresponding to the exhausted air is supplied from a common source of make-up air to the second chamber 76 through the wafer delivery opening 51, and the flow rate is adjusted by the valves 88 and 89.

A shutter 91 is provided at the opening 71 of the partition wall 61, and is mainly used for maintenance. When the first chamber 77 is open at the time of maintenance, the shutter 91 is closed so that the dust does not flow from the first chamber 77 to the second chamber 76 through the opening 71.

Instead of the movable louvres 85, it is possible to arrange the opening 86 so that opening area of the opening 86 can be adjusted, and a shutter may be provided to open and close the opening 86. Also, instead of a shutter, closing means such as a door may be used.

Figure 6:
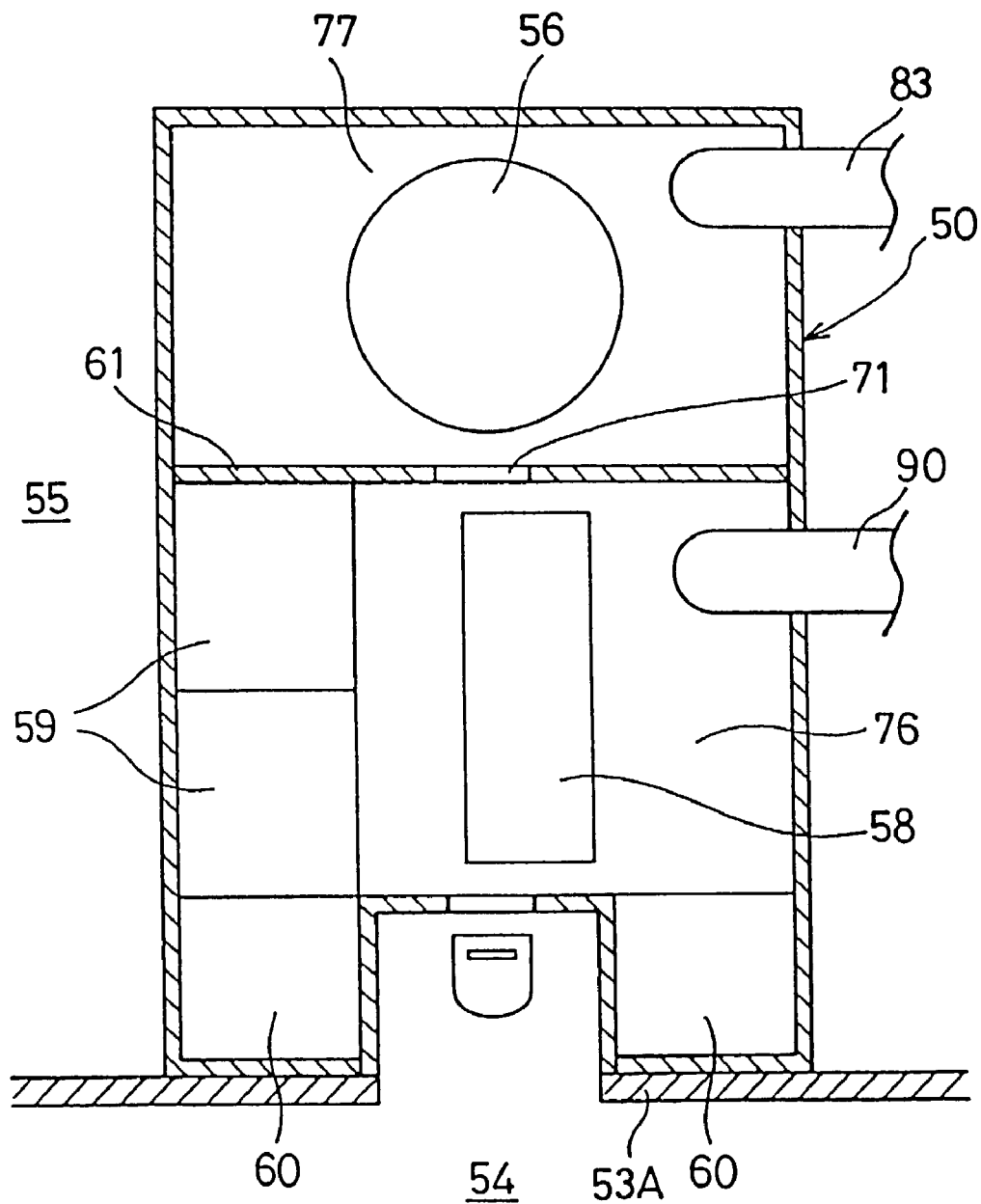
FIG. 6 is a cross-sectional plan view of the polishing apparatus of FIG. 3.

FIG. 6 is a cross-sectional plan view of the polishing apparatus 50. In the interior of the polishing apparatus 50 of a box shape, there are provided the polishing section 56, the cleaning section 59, the transfer section 58 and the control section 60 and the like. It can be seen that the polishing section 56 is located inwardly apart from the working zone 54.

The pattern of air flow through the polishing apparatus 50 will be described below with reference to FIG. 7.

The air in each of the first chamber 77 housing only the polishing section 56 and the second chamber 76 housing the cleaning section and other sections, is exhausted separately and independently so that the respective internal pressures decrease from high to low, in the order of the working zone 54 of the clean room, the second chamber 76 and the first chamber 77. The air from the first and second chambers 76 and 77 is exhausted through the main ducts 83 and 90 as shown in FIG. 7. The clean air from the working zone 54 enters the second chamber 76 having the cleaning section 59 and others, and a part of air flows towards the main duct 90 in the second chamber 76. The other part of the clean air entering the second chamber 76 passes through the opening 71 of the partition wall 61 and enters the first chamber 77 having only the polishing section 56, and flows towards the duct 83. The flow patterns of the clean air-stream are illustrated by the arrows in FIG. 7.

Because the air is directed from the high pressure side to the low pressure side and exhausted to maintain a pressure gradient in the order of the clean room, the second chamber 76 and the first chamber 77, counterflow does not occur. It can be understood that the mist and the dust particles generated in the polishing section 56 do not flow in the clean room area, and there is no contamination of the cleaning devices because the highly contaminated ambient air does not flow from the first chamber 77 to the second chamber 76.

Further, exhausting and intaking of the ambient air of the chambers and internal pressure of the chambers in the polishing apparatus 50 are controlled by controlling the louvres 85 at the opening 86 and the valves 80, 82, 88 and 89 on the ducts 83 and 90. Therefore, the air-stream can be controlled suitably by a minimal number of control devices.

It should also be noted that the simple shape of division of the interior structure of the polishing apparatus 50 leads to fix the direction of air-stream in the polishing apparatus and to thus make the designing of the polishing apparatus simple, and leads to a simple construction of the exhaust ducting system. Simplified design provides high exhausting efficiency because pressure drop which may be caused due to bends and long exhaust passages or a complex division of the interior of the polishing apparatus can be prevented.

Next, the movement of the semiconductor wafers inside the polishing apparatus 50 will be described below with reference to FIG. 8.

The semiconductor wafers from the working zone 54 are brought into the polishing apparatus 50, and pass through the second chamber 76 having the cleaning section 59 and others, and reach the first chamber 77 having the polishing section 56 to be polished. Polishing is carried out using abrasive slurry, and therefore, the polished semiconductor wafers are contaminated with residual abrasive slurry. The polished semiconductor wafers are transferred from the first chamber 77 to a cleaning device 59a in the second chamber 76. The cleaned semiconductor wafers are transferred to a cleaning device 59b to further enhance the degree of cleanliness. The cleaning unit 74 includes the cleaning devices 59a and 59b. The cleaned semiconductor wafers are dried in the cleaning device 59b, and then transferred to the working zone 54. The movement of the semiconductor wafers are shown by arrows in FIG. 8.

Figure 7:
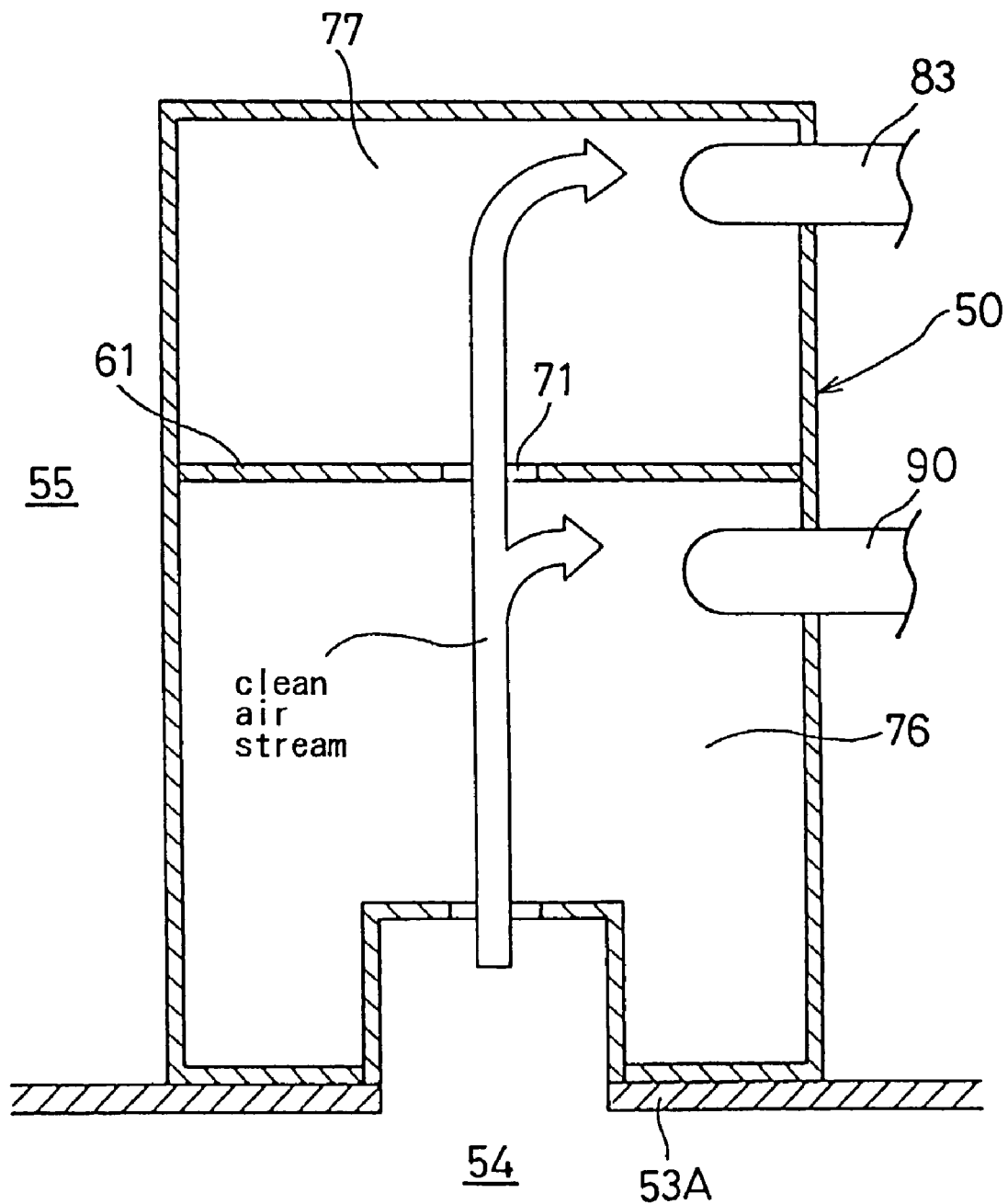
FIG. 7 is a schematic illustration showing the flow of air in the polishing apparatus of FIG. 3.
Figure 8:
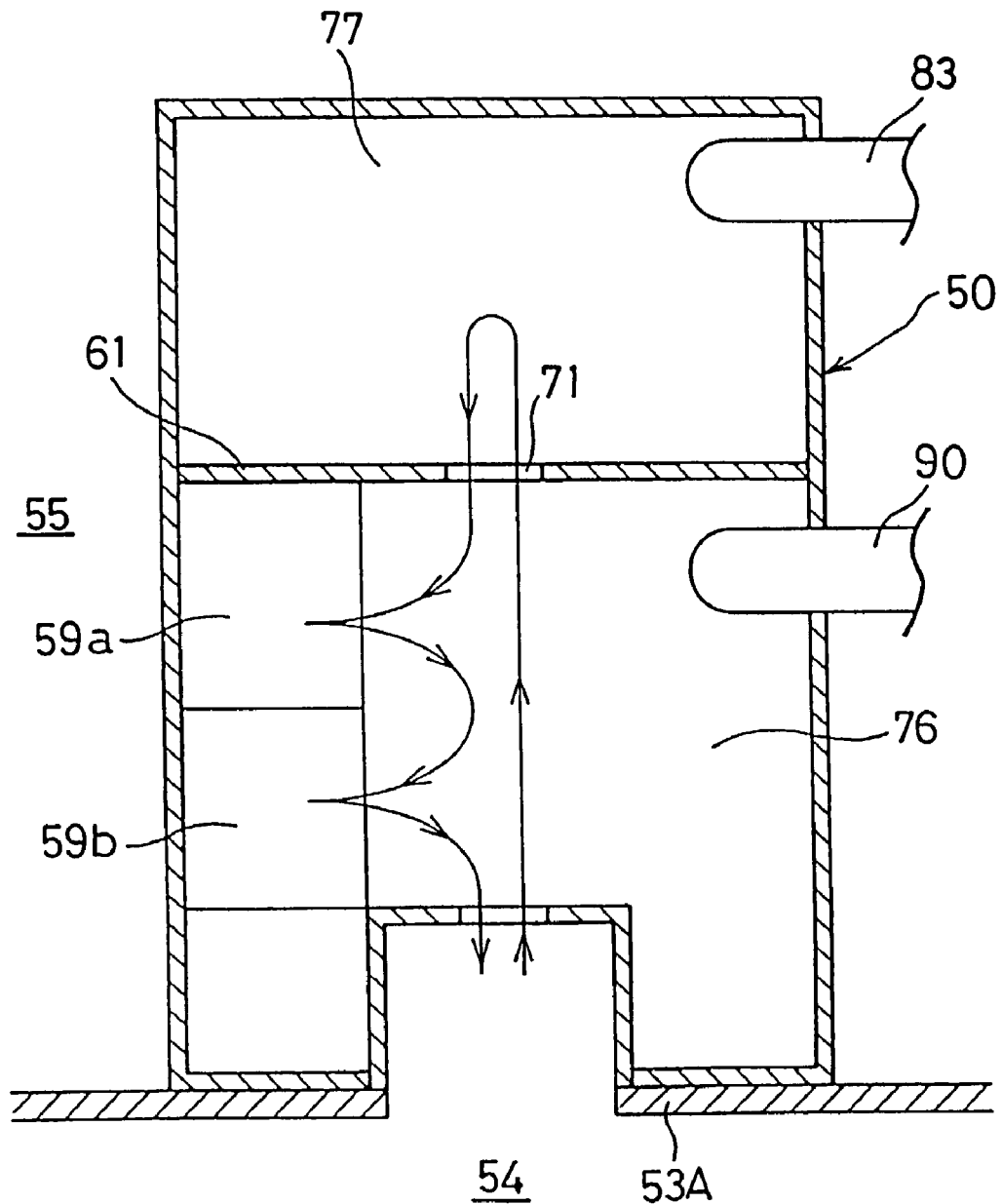
FIG. 8 is a schematic illustration showing the movement of semiconductor wafers in the polishing apparatus of FIG. 3.

As illustrated in FIGS. 7 and 8, the movement of the semiconductor wafers which is being cleaned and discharged from the polishing apparatus is counter to the air-stream, therefore transfer of the semiconductor wafer in the cleaning area is conducted in the direction of higher degree of cleanliness, thereby preventing contamination of the semiconductor wafers during the transfer step.

In order to achieve the above effect, the following considerations are given to the arrangement of the semiconductor wafer cleaning devices. When a plurality of cleaning devices are to be used, the cleaning devices providing a progressively higher degree of cleanliness should be arranged in the counter direction to the clean air-stream. In other words, when the degree of cleanliness of the semiconductor wafer provided by a cleaning device is higher, the device should be positioned at further upstream side of air-stream. In FIG. 8, this is illustrated by the positioning of the cleaning devices 59a and 59b. When a degree of cleanliness of the semiconductor wafer in the cleaning device 59b is higher than that in the cleaning device 59a, the cleaning device 59b is disposed at the upstream side of the cleaning device 59a. The same principle applies to the semiconductor wafers in transit moving between a plurality of cleaning devices.

The polishing apparatus according to the second embodiment of the present invention offers the following advantages:

(1) The clean room and the cleaning section 59 are not contaminated with the contaminants generated in the polishing section 56.

(2) The polished and cleaned semiconductor wafers or the driving components such as motors or power transmission members are not contaminated with the contaminants such as dust particles and mist produced by the polishing process.

(3) The control of air flow in each chamber can be achieved by a minimal number of control devices.

(4) The direction of the air-stream is fixed, and the design of the exhaust system is simplified.

(5) Pressure loss is minimized and high exhausting efficiency is achieved.

A polishing apparatus according to a third embodiment of the present invention will be described below with reference to FIGS. 9 and 10.

Figure 4:
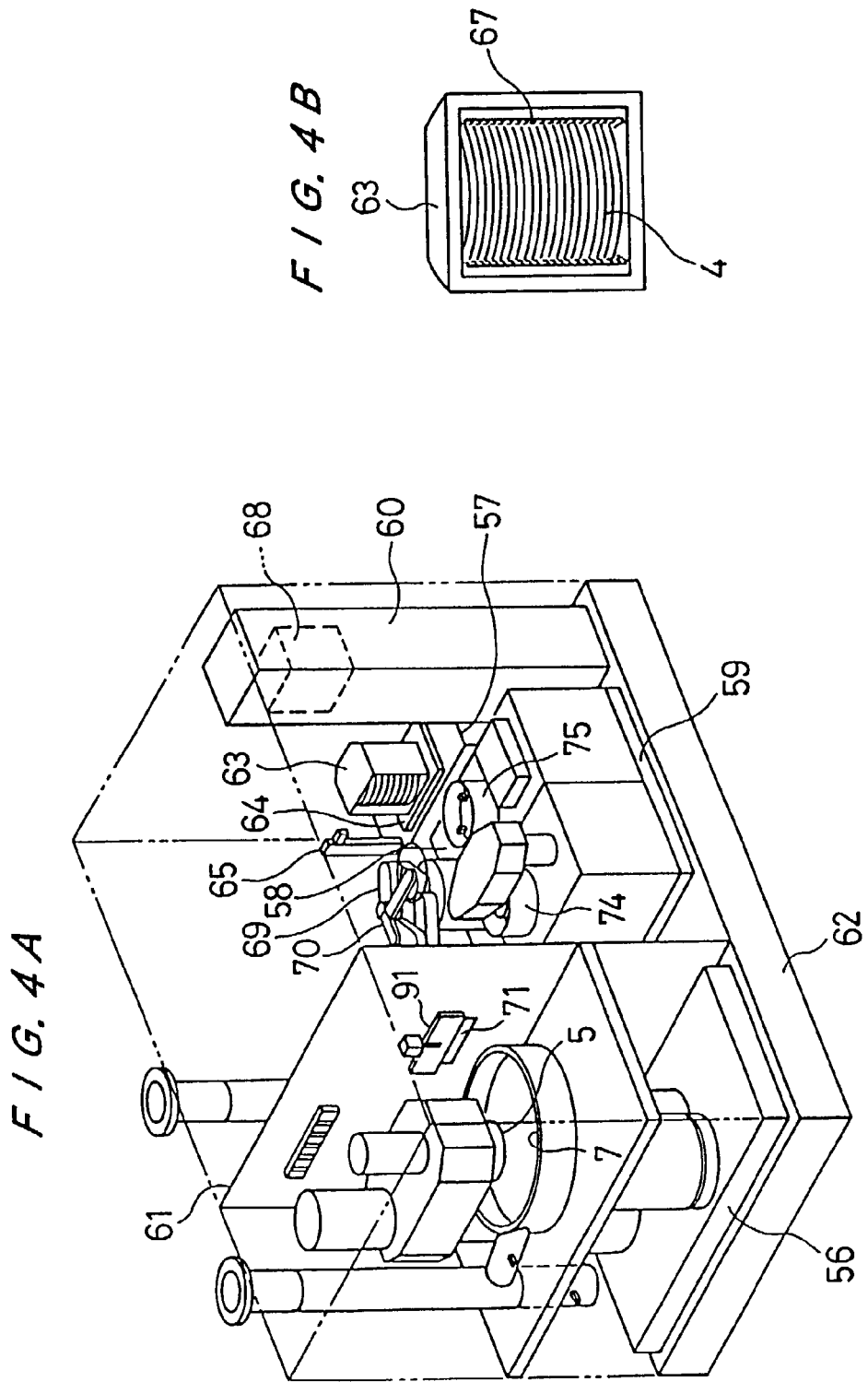
FIG. 4A is a perspective view of the interior of the polishing apparatus of FIG. 3.
FIG. 4B is a perspective view of a cassette shown in FIG. 4A.
Figure 9:
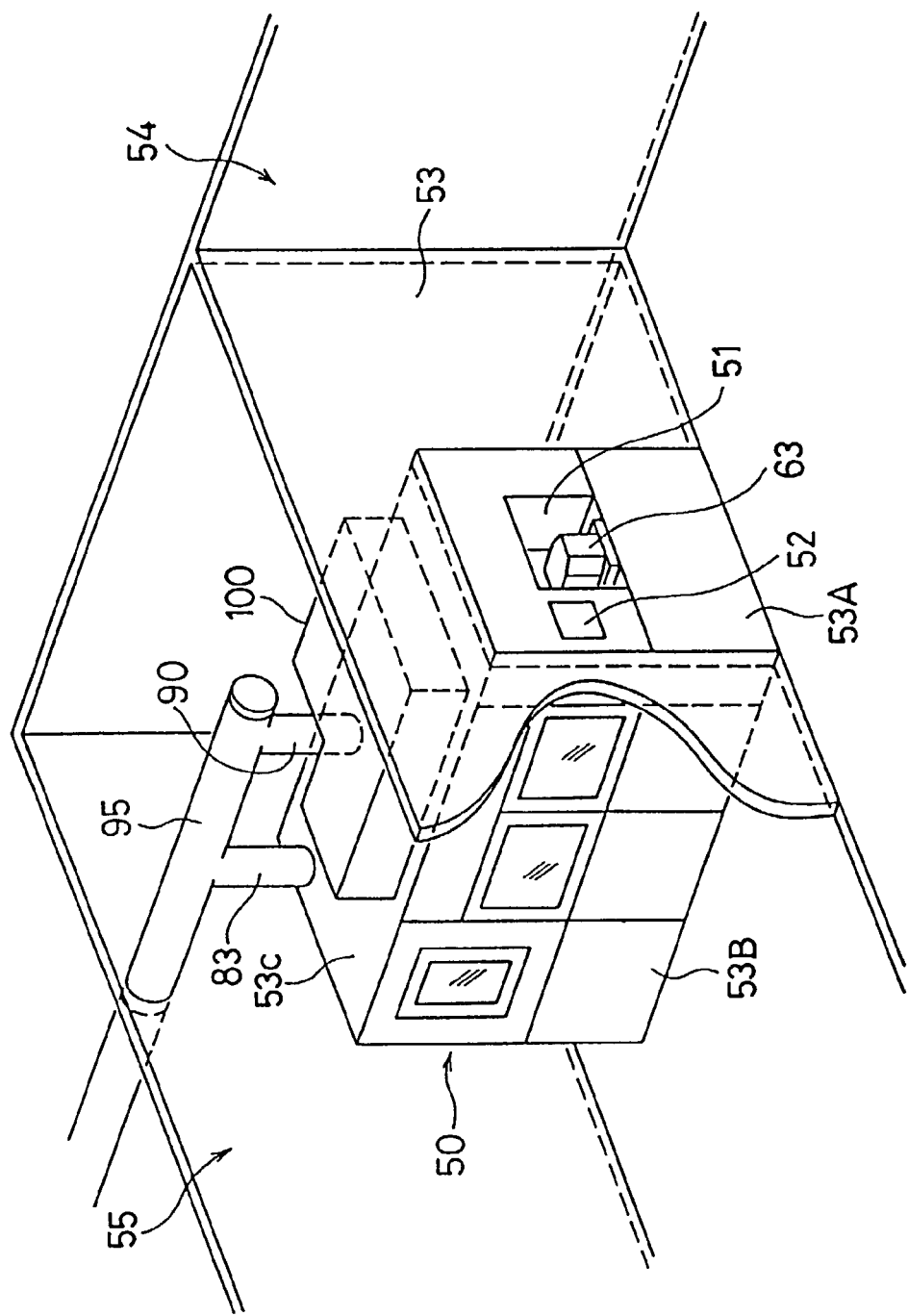
FIG. 9 is a perspective view of a polishing apparatus according to a third embodiment of the present invention.
Figure 10:
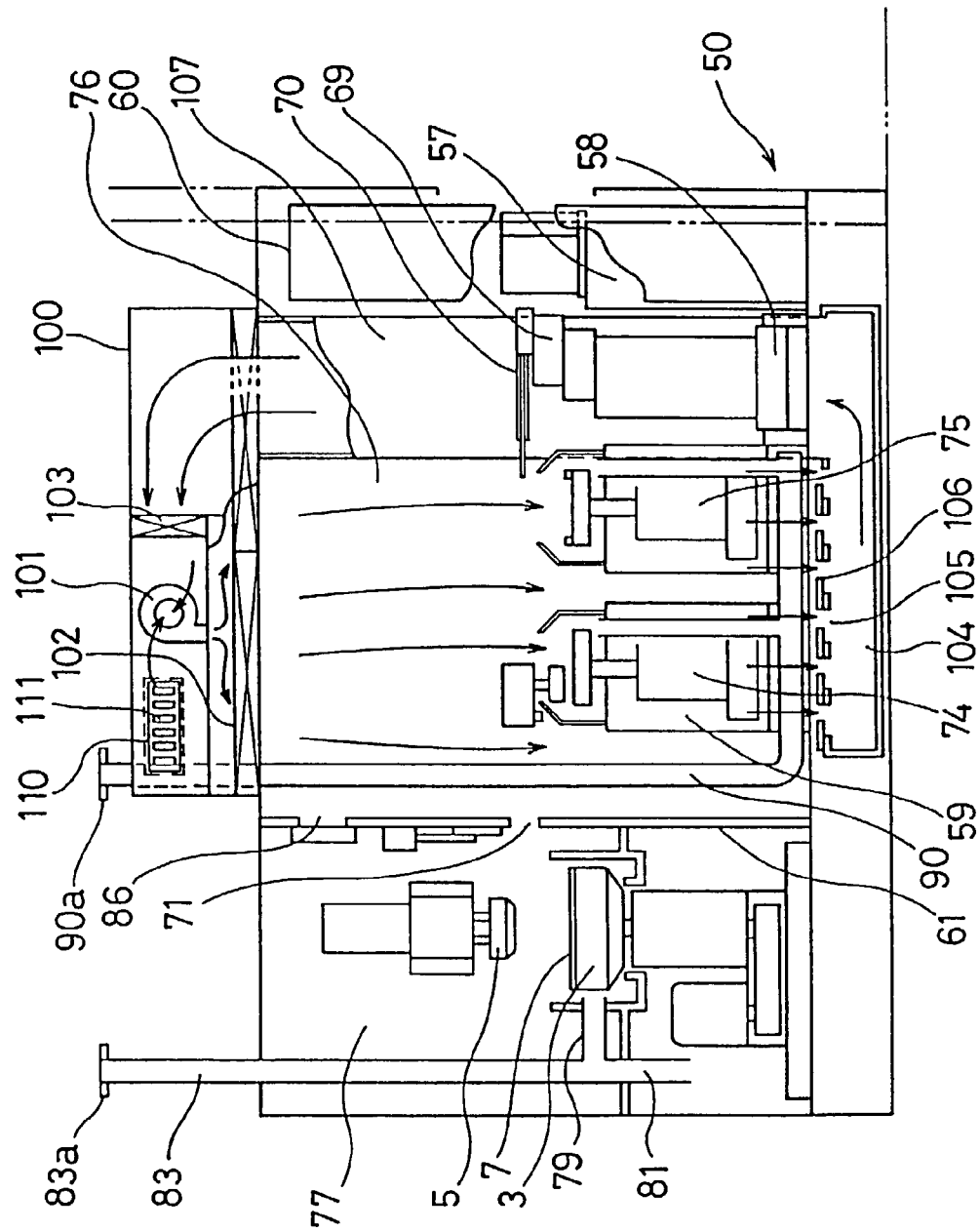
FIG. 10 is a side view showing the internal arrangement of the polishing apparatus of FIG. 9.

The polishing apparatus in FIGS. 9 and 10 is identical to the polishing apparatus in FIGS. 3 through 5 with the exception that a filtering unit 100 is provided on the ceiling 53C. Those parts shown in FIGS. 9 and 10 which are identical to those shown in FIGS. 3 through 5 are denoted by identical reference numerals, and will not be described in detail below.

As shown in FIG. 9, above the ceiling 53C, there is provided a filtering unit 100 for circulating clean air through the second chamber 76 housing the load/unload section 57, the transfer section 58 and the cleaning section 59.

FIG. 10 is a side view of the interior of the polishing apparatus 50. The polishing apparatus 50 is divided by the partition wall 61 into a first chamber 77 having the polishing section 56, and a second chamber 76 having the load/unload section 57, the transfer section 58, the cleaning section 59 and the control section 60.

As shown in FIG. 10, the filtering unit 100 has a fan 101, a filter 102 having a 0.1 micrometer filtering capacity disposed at the exit side of the fan 101, and a chemical filter 103 for filtering harmful gases disposed at the intake side of the fan 101. The cleaned air discharged from the filter 102 is blown down into the general area over the movement range of the robot 69 and an area including the cleaning unit 74 and the drying unit 75, i.e. over the area of the movement of the semiconductor wafers. The velocity of air flow is in the range of 0.3 to 0.4 m/s so as to be effective for preventing cross contamination of adjacently placed semiconductor wafers. A part of the air blown into the above areas flows into the first chamber 77 and the respective openings of the cleaning unit 74 and the drying unit 75, but most of the air descends to the floor of the polishing apparatus 50.

The floor is provided with a box shaped duct header 104 with a flat surface. The duct header 104 has a number of openings 105 each having a louvre 106 for adjusting the opening area of the opening 105. The duct header 104 is connected to the filtering unit 100 through a duct pipe 107. The air which has descended to the floor passes through the openings 105 and flows into the duct header 104, and is introduced into the chemical filter 103 through the duct pipe 107.

Therefore, the harmful gases from the wet semiconductor wafers 17 and liquid drops which adhere to the finger 20 of the robot 19 and contain traces of abrasive slurry are removed together with the descending air flow by the chemical filter 103. The abrasive material and the ground-off particles of the semiconductor wafer which may have dripped with cleaning solvent and dried on the floor are prevented from being scattered by the descending air, and a part of such particles is removed by the filter 102.

The make-up air is supplied mainly from air supply openings 111 each having a louvre 110 disposed on the filtering unit 100. A small amount of air is supplied from the cassette delivery opening 51. The descending speed of the air in the second chamber 76 can be adjusted by adjusting the louvres 106 of the duct header 104 and the louvres 110 of the air supply openings 111 for the make-up air.

FIG. 11 shows a modified embodiment of the third embodiment shown in FIGS. 9 and 10.

In this embodiment, the filtering unit 100 is removed, and the ceiling of the second chamber 76 is also removed. An exhaust fan 112 is provided at the bottom surface of the duct header 104. This type of apparatus can be used in the case where there is no generation of harmful gases from the abrasive slurry and the polishing apparatus is installed in a clean room having a relatively high cleanliness. It is possible to use only the down-flow ambient air within the clean room. The down-flow air is exhausted to an exterior environment of the polishing apparatus 50 by the exhaust fan 112. In this embodiment also, the base of the second chamber 76 is provided with numerous floor openings 105 on top of the duct header 104, and the ambient air is exhausted outside by the exhaust fan 112 through the duct header 104.

The duct header 104 does not necessarily need to be a flat pipe shape, but pipes having other shape can also be used so long as they are capable of collecting the down-flow ambient air. Also, the operational parameters of the apparatus, such as filtering ability and the need for a chemical filter, will be dependent on a particular degree of cleanliness in the clean room and the type of abrasive slurry to be used in the polishing operation.

According to the third embodiment shown in FIGS. 9 through 11, the prevention of particulate contamination of the semiconductor wafers which have been polished and cleaned in the polishing apparatus as well as removal of harmful gases can be achieved. Therefore, the polishing apparatus can be installed in the clean room, thus removing the restrictions imposed on production conditions, such as the types of abrasive slurry, and offering higher degree of freedom in arranging the polishing operation to handle a variety of types of surface films of the semiconductor wafers for production of a wide variety of semiconductor devices.

The polishing apparatus of the present invention can process various workpieces including a semiconductor wafer, a glass substrate and the like.

In the second and third embodiments of FIGS. 3 through 11, although the loading station and the unloading station are integrally provided, they may be independently provided.

According to the polishing apparatus of the present invention, a semiconductor wafer is polished in the polishing section, the semiconductor wafer which has been polished is transferred from the polishing section to the cleaning section, and then the semiconductor wafer is cleaned and dried in the cleaning section. Therefore, the semiconductor wafer is discharged from the polishing apparatus in such a state the semiconductor wafer is clean and dry.

Although certain preferred embodiment of the present invention has been shown and described in detail, it should be understood that various changes and modification may be made therein without departing from the scope of the appended claims.

What is claimed is:

1. A method for polishing and then cleaning and drying a wafer comprising:
    preparing a cassette having a plurality of storage shelves on which wafers are placed;
    detecting the number of the wafers and a position of said storage shelves by a sensor;
    taking out one of the wafers from said cassette by a robot;
    polishing the wafer;
    transferring the polished wafer;
    cleaning and then drying the wafer;
    returning the polished, cleaned and dried wafer to said cassette.

2. A method according to claim 1, wherein said returning the wafer to said cassette is conducted by said robot.

3. A method according to claim 1, wherein said polishing is conducted using an abrasive cloth and slurry.

4. A method according to claim 1, further comprising inverting the wafer after said taking out the wafer from said cassette and before said polishing the wafer.

5. A method according to claim 4, further comprising inverting the wafer after said polishing the wafer and before said returning the wafer to said cassette.

6. A method according to claim 1, wherein the wafer is cleaned and dried at a plurality of stages.

7. A polishing apparatus comprising:
    a load/unload section for placing a cassette having a plurality of storage shelves on which wafers are placed;
    a sensor for detecting the number of the wafers in said cassette and a position of said storage shelves;
    a robot for taking out one of the wafers to be polished from said cassette;
    a polishing section for polishing the wafer; and
    a cleaning section for cleaning and drying the polished wafer;
    wherein the polished, cleaned and dried wafer is returned to said cassette by said robot.

8. An apparatus according to claim 7, wherein the wafer is returned to said cassette by said robot.

9. An apparatus according to claim 7, wherein the wafer is polished using an abrasive cloth and slurry.

10. An apparatus according to claim 7, wherein the wafer is inverted after taking out the wafer from said cassette and before polishing the wafer.

11. An apparatus according to claim 10, wherein the wafer is inverted after polishing the wafer and before returning the wafer to said cassette.

12. An apparatus according to claim 7, wherein the wafer is cleaned and dried at a plurality of stages.

13. An apparatus according to claim 7, further comprising a control section for storing a detected data of the number of the wafers and the position of said storage shelves.

14. A method for polishing and then cleaning and drying a wafer comprising:
    preparing a cassette having a plurality of storage shelves on which wafers are placed;
    taking out a wafer from said cassette by a robot;
    transferring the wafer to a polishing section through an opening of a partition wall which partitions said polishing section and a cleaning section;
    polishing the wafer in said polishing section;
    transferring the wafer to said cleaning section through said opening;
    cleaning the wafer in said cleaning section;
    drying the wafer in said cleaning section; and
    transferring the wafer from said cleaning section by said robot onto one of said storage shelves of said cassette.

15. A method according to claim 14, further comprising detecting the number of the wafers and a position of said storage shelves by a sensor before taking out the wafer from said cassette.

16. A method according to claim 14, wherein air in each of said polishing section and said cleaning section is exhausted separately and independently so that an internal pressure of said cleaning section is higher than an internal pressure of said polishing section.

17. A method according to claim 14, wherein said polishing is conducted using an abrasive cloth and slurry.

18. A method according to claim 14, further comprising inverting the wafer after said taking out the wafer from said cassette and before said polishing the wafer.

19. A method according to claim 18, further comprising inverting the wafer said after polishing the wafer and before said transferring the wafer to said cassette.

20. A method according to claim 14, wherein the wafer is cleaned and dried at a plurality of stages.

* * * * *